United States Patent [19]

Yamamoto et al.

[11] Patent Number: 5,223,372
[45] Date of Patent: Jun. 29, 1993

[54] CHEMICAL MAT FILM AND A PHOTOSENSITIVE FILM COMPRISING AN O-NAPHTHOQUININE DIAZIDE COMPOUND AND A BINDER COATED OVER THE CHEMICAL MAT FILM

[75] Inventors: Shinichi Yamamoto, Yashio; Hiromi Masamura, Urawa, both of Japan

[73] Assignee: Somar Corporation, Japan

[21] Appl. No.: 410,752

[22] Filed: Sep. 22, 1989

[30] Foreign Application Priority Data

Sep. 27, 1988 [JP] Japan ................. 63-243071

[51] Int. Cl.$^5$ .............. G03C 1/91; G03C 1/95; G03F 7/09; G03F 7/023
[52] U.S. Cl. .................... 430/166; 430/191; 430/192; 430/193; 430/531; 430/533; 430/950; 428/323; 428/409
[58] Field of Search ............ 430/271, 166, 950, 961, 430/167, 191, 192, 193, 531, 533; 428/323, 76, 409

[56] References Cited

U.S. PATENT DOCUMENTS

| | | | |
|---|---|---|---|
| 3,154,461 | 3/1960 | Johnson | 428/323 |
| 3,370,951 | 11/1966 | Hasenauer | 430/950 |
| 3,589,905 | 6/1971 | Reedy et al. | 430/950 |
| 3,793,052 | 2/1974 | Taylor | 428/409 |
| 3,811,924 | 5/1974 | Gallagher et al. | 430/950 |
| 3,850,640 | 11/1974 | Babbitt et al. | 430/528 |
| 3,870,549 | 3/1975 | Ruygrok | 428/409 |
| 3,920,456 | 11/1975 | Nittel et al. | 430/950 |
| 4,066,820 | 1/1978 | Kelly et al. | 428/483 |
| 4,131,466 | 12/1978 | Nomura et al. | 96/49 |
| 4,142,894 | 3/1979 | Hori et al. | 430/950 |
| 4,232,117 | 11/1980 | Naoi et al. | 430/950 |
| 4,235,959 | 11/1980 | Thijs et al. | 430/950 |
| 4,264,692 | 4/1981 | Held | 430/281 |
| 4,264,719 | 3/1981 | Kameoka et al. | 430/950 |
| 4,287,299 | 9/1981 | Himmelmann et al. | 430/950 |
| 4,289,843 | 9/1981 | Boutle et al. | 430/271 |
| 4,382,115 | 5/1983 | Takahashi | 428/424.6 |
| 4,396,672 | 8/1983 | Adesko | 428/323 |
| 4,399,179 | 8/1983 | Minami et al. | 428/323 |
| 4,416,963 | 11/1983 | Takimoto et al. | 430/950 |
| 4,426,437 | 1/1984 | Fisch et al. | 430/271 |
| 4,507,383 | 3/1985 | Tsuruta et al. | 430/271 |
| 4,542,095 | 9/1985 | Steklenski et al. | 430/271 |
| 4,557,994 | 12/1985 | Nagano et al. | 430/166 |
| 4,562,140 | 12/1985 | Kohmura et al. | 430/950 |
| 4,610,924 | 9/1986 | Tomagawa et al. | 430/950 |
| 4,678,742 | 7/1987 | Tamagawa et al. | 428/323 |
| 4,748,099 | 5/1988 | Shimada et al. | 430/49 |
| 4,848,348 | 11/1989 | Craighead | 428/323 |
| 4,870,001 | 9/1989 | Ashida | 430/950 |
| 4,879,201 | 11/1989 | Hasegawa | 430/281 |
| 4,902,770 | 2/1990 | Ishii et al. | 430/271 |
| 4,945,025 | 7/1990 | Nakamura et al. | 430/961 |

Primary Examiner—Charles L. Bowers, Jr.
Assistant Examiner—John S. Chu
Attorney, Agent, or Firm—Lorusso & Loud

[57] ABSTRACT

A chemical mat film having good writability and printability is disclosed which includes a transparent film, a chemical mat layer provided on one or both sides of the transparent film and containing finely divided solid particles which provide surface roughness, and an overcoat layer formed of a polymeric material and provided over the surface of the chemical mat layer, the overcoat layer having a surface roughness which is substantially coincident with that of the chemical mat layer. The chemical mat film may be used as a substrate of a photosensitive film for supporting a photosensitive layer thereon.

7 Claims, 1 Drawing Sheet

CHEMICAL MAT FILM AND A PHOTOSENSITIVE FILM COMPRISING AN O-NAPHTHOQUININE DIAZIDE COMPOUND AND A BINDER COATED OVER THE CHEMICAL MAT FILM

BACKGROUND OF THE INVENTION

This invention relates to a composite material useful as a chemical mat film and a photosensitive film.

There is a known chemical mat film which comprises a transparent plastic film, and a chemical mat layer containing a binder and finely divided solid particles. Because of the presence of the fine particles, the surface of the chemical mat layer is slightly roughened. As a result, the chemical mat film is writable with a pencil or a ball-point pen and permits a coating such as a photosensitive coating to be provided thereon. Thus, such a chemical mat is widely utilized in many applications, for example, as tracing films for drawing and as substrates for photosensitive films to be used for the preparation of maps, etc. In such a case, the photosensitive film is subjected to image exposure and then developed to form a resin image. The resin image is thereafter colored with a dye.

When used as a substrate of photosensitive films, however, known chemical mat films pose a problem that not only the resin image to be colored but also the chemical mat layer is colored or stained during the formation of the colored image. To cope with this problem, there is proposed a method wherein a thermosetting or a UV-curable resin is incorporated into the chemical mat layer. In this case, the resin should be completely cured by heating or by irradiation of UV rays prior to the coloring step and, thus, this method is not economically advantageous. In addition, the curing often causes curls of the film. As an alternative method for solving the problem of coloring of the chemical mat layer, a specific composition for the chemical mat layer may be used. However, there have been no successful compositions capable of providing a stainless chemical mat layer.

BRIEF SUMMARY OF THE INVENTION

It is, therefore, an object of the present invention to provide a chemical mat film which has good printability and writability.

Another object of the present invention is to provide a chemical mat film which may be used as a substrate for supporting a photosensitive layer thereon.

It is a further object of the present invention to provide a photosensitive film which is not stained with dyes during color development of the photosensitive film.

In accomplishing the foregoing objects, the present invention provides a composite material comprising a transparent film, a chemical mat layer provided over at least one side surface of said transparent film and having a roughened surface provided by finely divided solid particles contained therein, and an overcoat layer formed of a polymeric material and provided over the surface of the chemical mat layer opposite the transparent film, said overcoat layer having a roughened surface which is substantially coincident with that of the chemical mat layer.

BRIEF DESCRIPTION OF THE DRAWING

Other objects, features and advantages of the invention will become apparent from the detailed description of the invention which follows, when considered in light of the accompanying drawing, in which.

DETAILED DESCRIPTION OF THE INVENTION

Figure 1:
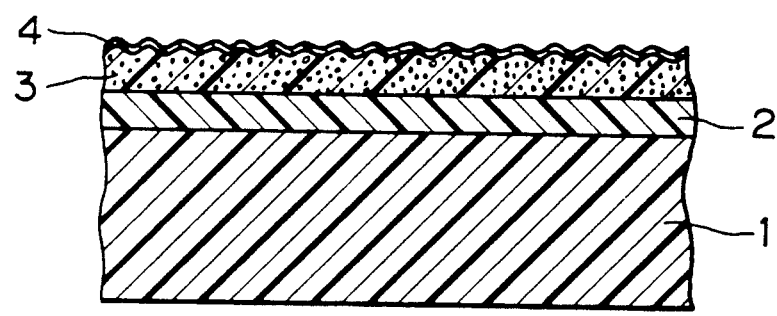
FIG. 1 is a cross-sectional view diagrammatically showing one embodiment of a chemical mat film according to the present invention.

Referring first to FIG. 1, the reference numeral 1 denotes a transparent film formed of a polymeric material such as a polyester, a polyamide, a polypropylene, a cellulose acetate, a polyvinyl chloride, a polystyrene, polymethacrylate, a methacrylate copolymer or a polycarbonate. The thickness of the transparent film is not specifically limited but generally in the range of 25-250 $\mu$m.

Designated as 2 is an anchor layer formed of a polymeric material. The anchor layer 2, which is not essential but is optional, has generally a thickness of 0.3-1.5 $\mu$m and serves to improve the adhesion of a chemical mat layer, which is described hereinafter, to the transparent film 1.

Provided over the anchor layer 2 is the above-mentioned chemical mat layer 3 formed by applying a coating liquid containing a binder and finely divided solid particles to the anchor layer 2. As the binder, there may be used any conventionally used polymeric material such as a thermoplastic resin, a thermosetting resin or a resin curable by irradiation with UV rays. As the solid particles, there may be used any conventionally used solid particles. Generally, an inorganic filler such as natural silica, synthetic silica, colloidal silica, diatomaceous earth, clay, quartz, talc, calcium carbonate, magnesium carbonate, titanium oxide, aluminum oxide or aluminum hydroxide is suitably used. The solid particles generally have an average particle size of 0.1-10 $\mu$m, preferably 0.5-5 $\mu$m. The solid particles are generally used in an amount of 10-200 parts by weight, preferably 60-120 parts by weight per 100 parts by weight of the binder. The chemical mat layer 3 has generally a thickness of 1-10 $\mu$m, preferably 3-7 $\mu$m.

The preferred composition of a coating liquid for the formation of the chemical mat layer 2 includes:

(a) 100 parts by weight, calculated as solids, of an acrylic resin emulsion;

(b) 0.5-10 parts by weight, preferably 1-5 parts by weight of a dialkylsulfonate of the formula:

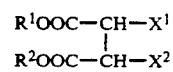

wherein $R^1$ and $R^2$, independently from each other, stand for an alkyl having 5-15 carbon atoms, $X^1$ is hydrogen or $-SO_3M$ where M is an alkali metal or ammonium and $X^2$ is $-SO_3M$ where M is as defined above;

(c) 5-70 parts by weight, preferably 10-50 parts by weight of a melamine resin;

(d) 0.1-10 parts by weight, preferably 0.5-8 parts by weight of a nonionic surfactant;

(e) 0.1-10 parts by weight, preferably 1-5 parts by weight of a crosslinking catalyst; and (f) 10-200 parts by weight, preferably 60-120 parts by weight of an inorganic filler having an average particle size of 0.1-10 μm, preferably 0.5-5 μm.

The above components (a)-(f) will be explained in more detail below.

(a) Acrylic resin emulsion

An emulsion of an acrylic resin such as a homopolymer or copolymer of an acrylic monomer such as acrylic acid, methacrylic acid, an acrylate (e.g. methyl acrylate or ethyl acrylate), a methacrylate (e.g. methyl methacrylate or ethyl methacrylate) or acrylonitrile is used. Vinyl acetate and styrene are suitable examples of comonomers of the acrylic copolymers. The emulsion may be of both nonionic type and anionic-type and may be neutral, weakly alkaline or weakly acidic. The concentration (solid content) of the emulsion is not specifically limited.

(b) Dialkylsulfonate

The alkyl groups $R^1$ and $R^2$ preferably have 7-12 carbon atoms. Sodium dioctylmonosulfosuccinate of the formula:

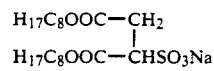

is an example of the suitable dialkylsulfonate.

(c) Melamine resin

Any known melamine resin may be used. A melamine-urea resin may also be suitably used.

(d) Nonionic surfactant

Illustrative of suitable nonionic surfactants are ether-type surfactants such as polyoxyethylene alkyl ethers, polyoxyethylene secondary alcohol ethers, polyoxyethylene alkylphenyl ethers and polyoxyethylenepolyoxypropylene alkyl ethers; ester-ether-type surfactants such as polyoxyethylene glycerin fatty acid esters, polyoxyethylene and sorbitan fatty acid esters; ester-type surfactants such as polyethylene glycol fatty acid esters and polyglycerin fatty acid esters; and nitrogen-containing-type surfactants such as fatty acid amide of polyoxyethylenealkylamines.

The surfactant is used for the purpose of increasing the viscosity of a coating liquid for the formation of the chemical mat layer so as to prevent precipitation of inorganic fillers and to improve efficiency of coating operations.

(e) Catalyst

Ammonium chloride and ammonium oxalate may be suitably used. The catalyst is considered to serve to function as a crosslinking catalyst for both the melamine resin and the acrylic emulsion. Ammonium chloride when heated decomposes to form ammonia and hydrogen chloride. The latter acts as a cross-linking catalyst while the former is removed during the drying of the coated layer.

(f) Inorganic filler

The average particle size of the inorganic filler is desirably in the range of 0.1-10 μm for reasons of writability of the resulting chemical mat layer 3 and dispersibility of the coating liquid. A mixed filler composed of about 25 parts by weight of aluminum hydroxide, about 20 parts by weight of calcium carbonate, about 5 parts by weight of silicon dioxide and about 1 part by weight of titanium oxide gives especially good results.

The chemical mat layer 3 may be obtained by coating the above coating composition dispersed in a suitable medium such as water, followed by drying and heating generally at 110°-150° C. The chemical mat layer 3 preferably has a center line average height of 0.5-1.3 μm, more preferably 0.6-1.0 μm.

The chemical mat layer 3 is overlaid with an overcoat layer 4 whose surface is roughed correspondingly to the surface roughness of the chemical mat layer. Thus, for reasons of obtaining the surface roughness, it is preferred that the overcoat layer 4 has a thickness of 0.01-0.2 μm, more preferably 0.02-0.1 μm. The overcoat layer 4 preferably has a center line average height of 0.4-1.2 μm, more preferably 0.6-1.0 μm. The overcoat layer 4 is formed of a polymeric material. Any polymeric material may be used in the present invention as long as it gives a film. Thermoplastic resins such as polyesters, polyamides, polypropylenes, polycarbonates and polyvinyl alcohols are generally used. A thermosetting resin or a UV-curable resin may also be used. A thermoplastic polyester resin (saturated polyester resin) which may be of a water-dispersion type or a solution-type is particularly suitable. The previously described anchor layer 2 may be formed of the resin to be used for the formation of the overcoat layer 4.

Because of the presence of the overcoat layer 4 having a surface roughness similar to that of the chemical mat layer 3, the chemical mat film according to the present invention has good writability and printability and makes it easy to provide a further layer such as a photosensitive layer thereon. In addition, the presence of the overcoat layer 4 can improve the resistance of the chemical mat layer 3 to chemicals and can prevent the chemical mat layer 3 from being colored during a dyeing step. In the present invention, the chemical mat layer 3 and the overcoat layer 4 may be provided on both sides of the transparent film 1, if desired.

Figure 2:
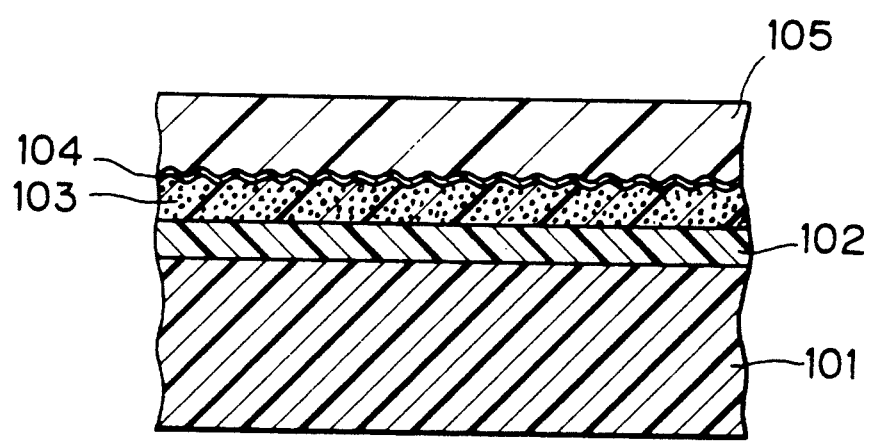
FIG. 2 is a cross-sectional view diagrammatically showing another embodiment of the present invention to be used as a photosensitive film.

FIG. 2 illustrates another embodiment of the present invention in the form of a photosensitive film, in which corresponding elements have been designated by the same reference numerals as part of a "100" series. Thus, the reference numerals 101-104 designate a transparent film, an anchor layer, a chemical mat layer and an overcoat layer, respectively. Designated as 105 is a photosensitive layer which is known per se and which is generally composed of a photosensitive material and a binder.

As the photosensitive material, an o-naphthoquinone diazide compound which is insoluble in water but soluble in organic solvents is suitably used. Examples of such diazide compounds include an ester obtained from 1,2-naphthoquinone-diazide-4-sulfonic chloride and a m-cresol novolak resin or a phenol novolak resin, an ester obtained from 1,2-naphthoquinone-diazide-5-sulfonic chloride and a m-cresol novolak resin or a phenol novolak resin, a 1,2-naphthoquinone-5-sulfonic acid ester and 1,2-naphthoquinone-5-sulfonic acid amide.

As the binder, a homopolymer or a copolymer of vinylpyrrolidone having a molecular weight of at least about 18,000, preferably at least about 30,000 is suitably used. Examples of such copolymers include vinylpyrrolidone-vinyl acetate copolymers (vinylpyrrolidone content: 50 mole % or more), vinylpyrrolidone-dimethylaminoethyl methacrylate copolymers and salts thereof. These polymers may be used singly or as a mixture of two or more thereof. It is preferred that a relatively low molecular weight vinylpyrrolidone homopolymer or copolymer with a molecular weight of, for example, about 40,000 and a relatively high molecular weight vinylpyrrolidone homopolymer or copolymer with a molecular weight of, for example, about 630,000 be used in combination, with a mixing ratio of the former to the latter of 0.3:1 to 6:1, preferably 1:1 to 4:1, since the exposed area of the resulting photosensitive layer can exhibit excellent wash-out property in a developing step with a high degree of resolution.

The above azide compound (photosensitive material) and the pyrrolidone polymer (binder) are used in such a proportion so that the weight ratio of the azide compound to the pyrrolidone polymer is 0.05:1 to 0.5:1, preferably 0.15:1 to 0.35:1. Too low a weight ratio below 0.05:1 is disadvantageous because a clear image is not obtainable. On the other hand, when the weight ratio becomes greater than 0.5:1, the exposed area becomes poor in wash-out property and the developed image becomes difficult to dye.

The photosensitive layer 105 can contain an adjuvant binder other than the vinylpyrrolidone polymer. Illustrative of suitable adjuvant binder are phenol novolak resins, cresol novolak resins, styrene-maleic anhydride copolymers and polyvinylphenol. Such an adjuvant binder is used in an amount of 50% or less based on the total weight of the azide compound and the pyrrolidone polymer. When the amount of the adjuvant binder exceeds 50% by weight, it becomes difficult to obtain a beautiful colored image. In addition, it becomes necessary to develop the exposed image using a strong alkaline liquid. When the adjuvant binder is used in the above specified amount, on the other hand, the development may be effected with a neutral or weakly alkaline developing liquid and the coloring may be effected without difficulties.

The photosensitive layer 105 can contain various additives such as a preservability improving agent, a dye or pigment, a photosensitizer and a filler.

The photosensitive layer 105 may be formed by coating a coating liquid containing the above ingredients over a surface of the overcoat layer 104. Such a coating liquid may be prepared by first dissolving a predetermined amount (e.g. 5% by weight) of a vinyl pyrrolidone polymer in a suitable organic solvent such as an alcohol, a ketone, a halogenated hydrocarbon or a glycol and then mixing the resulting solution with an o-naphtoquinone diazide and, as desired, the above-described additives. An organic acid, e.g. parmitic acid, stearic acid and oxalic acid, an inorganic acid, e.g. phosphoric acid, and an acid anhydride, e.g. phthalic anhydride and tetrahydrophthalic anhydride may also be incorporated into the coating liquid.

Examples of other coating liquid compositions for the formation of the photosensitive layer 105 include those of a negative type such as:
(1) a combination of a polyvinyl alcohol with a perchromate;
(2) a combination of a diazo resin with a high molecular weight compound; and
(3) an aromatic azide compound with a high molecular weight compound The coating liquid is applied to an overcoat layer 104 by any known method such as a roll coating method, a bar coating method, a brush coating method or a spray coating method to form a photosensitive layer 105 with a thickness (after drying) of about 1–5, preferably about 2 $\mu$m. Drying may be effected with ambient air or with a hot air at about 80° C. for about 1 minute.

In use, an original is placed on the photosensitive layer 105 and UV rays are irradiated to obtain an exposed film. The exposed film is then developed in the following manner:
(1) The entire exposed surface is colored with a dye, washed with running water and dried;
(2) The exposed film is immersed in a weakly alkaline aqueous solution such as 2 wt % aqueous solution of sodium methasilicate at room temperature, washed with warm water at about 40° C., colored with a dye and then dried;
(3) The exposed film is immersed in a weakly alkaline aqueous solution such as 2 wt % aqueous solution of sodium methasilicate at about 35° C., washed with water, colored with a dye and then dried;
(4) The exposed film is immersed in an aqueous surfactant solution at room temperature, washed with warm water, colored with a dye and then dried; or
(5) The exposed film is immersed in an aqueous surfactant solution at about 35° C., washed with water, colored with a dye and then dried.

As the dye, there may be suitably used a direct dye. As the surfactant, a nonionic or amphoteric surfactant may be used. Since the chemical mat layer 103 is covered with the overcoat layer 104, when the film is exposed, developed and dyed, coloring of the background of the developed image is prevented. The the colored image is very clear. The photosensitive film is suitably used for the preparation of maps and secondary originals for machines, construction, plants, automobiles, airplanes and molds.

The following examples will further illustrate the present invention. Parts are by weight.

EXAMPLE 1

A dispersion containing 100 parts of an acrylic emulsion (solid content: 43% by weight), 0.5 part of sodium dioctylmonosulfosuccinate, 10 parts of a melamine resin, 2 parts of a nonionic surfactant, 0.4 part of ammonium chloride, 1.5 parts of silicon dioxide (average particle size: 4 $\mu$m (measured by the sedimentation method) specific surface area: 700 m$^2$/g (measured by the BET method)), 6 parts of calcium carbonate (average particle size: 1 $\mu$m, specific surface area: 210 m$^2$/g), 8 parts of aluminum hydroxide (average particle size: 1 $\mu$m), 0.3 part of titanium oxide (average particle size: 0.255 $\mu$m) and 70 parts of water was prepared by homogeneously mixing the above composition. The resultant dispersion was applied to a surface of an anchor layer, primed over a polyethylene terephthalate film (thickness: 100 $\mu$m) and formed of a polyester resin (VILONAL manufactured by Toyo Boseki K. K.), and dried to form a chemical mat layer having a thickness of 5 $\mu$m.

A coating liquid composed of 8 parts of the above polyester resin and 85.4 parts of water was then applied over the entire surface of the chemical mat layer and dried and heated to form an overcoat layer having a thickness of 0.06 $\mu$m and a center line average height of 0.6 $\mu$m. This chemical mat film was writable with a pencil and the written letters were erasable with a rubber eraser.

EXAMPLE 2

In 95 g of a 1:1 (by weight) mixed solvent were dissolved 5 g of high molecular weight polyvinylpyrrolidone having a molecular weight of 630,000. An ester (1 g) obtained by reaction of o-naphthoquinone-2-diazide-4-sulfonic chloride with m-cresol novolak resin was dissolved in the above solution with stirring to obtain a photosensitive coating liquid. This coating liquid was then applied over the surface of the overcoat layer of the chemical mat film obtained in Example 1 by the roll coating method, and dried with hot air at 80° C. for 1 minute to form a photosensitive layer having a thickness of 2 μm.

The thus obtained photosensitive film was overlaid with a positive original and subjected to irradiation by UV rays using a 3 KW mercury lamp positioned at a distance of 1 m from the surface of the film. The irradiation was continued for 30 seconds to obtain an exposed film. The exposed film was then immersed in Direct Fast Black (C.I. 27700) at 40° C. for 1 minute for coloring the exposed surface, and washed with city water by spraying. As a result, a black, sharp, high density relief positive image with high resolution was obtained. No coloring of the background was observed.

EXAMPLE 3

Example 2 was repeated in the same manner as described except a mixture of of polyvinylpyrrolidones with a molecular weight of 40,000 and polyvinylpyrrolidone with a molecular weight of 630,000 (mixing ratio: 3:1) was used in place of the high molecular weight polyvinylpyrrolidone to obtain a photosensitive film. This film was subjected to a series of exposure, development and coloring treatments in the same manner as that in Example 2. The exposed surface was more easily washed out in the development and washing steps than in Example 2. That is, while it was necessary in Example 2 to effect the washing by water spray, mere immersion of the film in stationary water was sufficient to effect the washing. The resulting colored image had good resolution.

EXAMPLE 4

In 95 g of a 1:1 (by weight) mixed solvent were dissolved 5 g of high molecular weight polyvinylpyrrolidone having a molecular weight of 630,000. An ester (1.2 g) obtained by reaction of o-naphthoquinone-2-diazide-4-sulfonic chloride with m-cresol novolak resin and a m-cresol novolak resin (1 g) were dissolved in the above solution with stirring to obtain a photosensitive coating liquid. This coating liquid was then applied over the surface of the overcoat layer of the chemical mat film obtained in Example 1 by the roll coating method, and dried with hot air at 80° C. for 1 minute to form a photosensitive layer having a thickness of 2 μm.

The thus obtained photosensitive film was overlaid with a positive original and subjected to irradiation by UV rays using a 3 KW mercury lamp positioned at a distance of 1 m from the surface of the film. The irradiation was continued for 30 seconds to obtain an exposed film. The exposed film was then immersed in a weakly alkaline 2 wt % aqueous solution of sodium methasilicate for 30 seconds. As a result, the non-exposed area of the photosensitive layer was colored light purple. The film was immersed in warm water at 40° C., then colored with Kayalus Black G conc. (C. I. 35255) by immersion at 40° C. for 2 minutes and thereafter washed with running water. As a result, a clear, black positive relief was obtained.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A composite material comprising a transparent film, a chemical mat layer provided over at least one surface of said transparent film and containing finely divided solid particles which provide said mat layer with surface roughness, an overcoat layer formed of a synthetic thermoplastic resin and provided over the surface of said chemical mat layer, said overcoat layer having a surface roughness which is substantially coincident with that of the chemical mat layer and a photosensitive layer provided over the surface of the overcoat layer, said photosensitive layer containing an o-naphthoquinone diazide compound which is insoluble in water but soluble in organic solvents and a binder, wherein said synthetic thermoplastic resin is selected from the group consisting of polyesters, polyamides, polypropylenes and polycarbonates, and wherein said chemical mat layer is a layer obtained by drying a coating which includes:

(a) 100 parts by weight, as solids, of an acrylic resin emulsion;
(b) 0.5–10 parts by weight of a dialkylsulfonate of the formula:

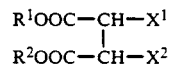

wherein $R^1$ and $R^2$, independently from each other, stand for an alkyl having 5–15 carbon atoms, $X^1$ is hydrogen or $-SO_3M$ where M is an alkali metal or ammonium and $X^2$ is $-SO_3M$ where M is as defined above;

(c) 5–70 parts by weight of a melamine resin;
(d) 0.1–10 parts by weight of nonionic surfactant;
(e) 0.1–10 parts by weight of a crosslinking catalyst; and
(f) 10–200 parts by weight of an inorganic filler having an average particle size of 0.1–10 μm.

2. A composite material according to claim 1, wherein said chemical mat layer has a center line average height of 0.5–1.3 μm.

3. A composite material according to claim 1, wherein said overcoat layer has a thickness of 0.01–0.2 μm.

4. A composite material according to claim 1, wherein said overcoat layer has a center line average height of 0.4–1.2 μm.

5. A composite material according to claim 1, wherein said inorganic filler is composed of about 25 parts by weight of aluminum hydroxide, about 20 parts by weight of calcium carbonate, about 5 parts by weight of silicon dioxide and about 1 part by weight of titanium oxide.

6. A composite material according to claim 1, wherein said binder is a homopolymer or copolymer of vinylpyrrolidone.

7. A composite material according to claim 1 wherein said overcoat material has a thickness of 0.02–0.1 μm.

* * * * *